United States Patent
Kong et al.

(10) Patent No.: US 12,471,263 B2
(45) Date of Patent: Nov. 11, 2025

(54) MULTILAYER TAPE INCLUDING PLURALITY OF MAGNETIC METAL PARTICLES AND ELECTRONIC ASSEMBLY INCLUDING THE SAME

(71) Applicant: 3M INNOVATIVE PROPERTIES COMPANY, St. Paul, MN (US)

(72) Inventors: Jiwoong Kong, Hwaseong-si (KR); Taehoon Noh, Suwon (KR); Jung Ju Suh, Seocho-gu (KR); Jinbae Kim, Ansan (KR)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 439 days.

(21) Appl. No.: 17/925,377

(22) PCT Filed: Apr. 27, 2021

(86) PCT No.: PCT/IB2021/053460
§ 371 (c)(1),
(2) Date: Nov. 15, 2022

(87) PCT Pub. No.: WO2021/234478
PCT Pub. Date: Nov. 25, 2021

(65) Prior Publication Data
US 2023/0200035 A1  Jun. 22, 2023

(30) Foreign Application Priority Data
May 20, 2020 (KR) .................. 10-2020-0060566

(51) Int. Cl.
*H05K 9/00* (2006.01)
*C09J 7/30* (2018.01)
(Continued)

(52) U.S. Cl.
CPC .............. *H05K 9/0083* (2013.01); *C09J 7/30* (2018.01); *C09J 9/00* (2013.01); *C09J 11/04* (2013.01);
(Continued)

(58) Field of Classification Search
CPC ... H01L 23/552; H05K 9/0083; H05K 9/0086
See application file for complete search history.

(56) References Cited

U.S. PATENT DOCUMENTS

| 6,274,951 B1 | 8/2001 | Saikalis et al. |
| 2012/0126381 A1 | 5/2012 | Uenda et al. |

(Continued)

FOREIGN PATENT DOCUMENTS

| JP | 2005158906 A | 6/2005 |
| JP | 2020013847 A | 1/2020 |

(Continued)

OTHER PUBLICATIONS

International Search Report received for PCT International Application No. PCT/IB2021/053460, mailed on Jul. 27, 2021, 3 pages.

(Continued)

*Primary Examiner* — David A Zarneke
(74) *Attorney, Agent, or Firm* — Gregg H. Rosenblatt; Clifton F. Richardson

(57) ABSTRACT

A multilayer tape according to an embodiment of the present disclosure includes: an adhesive layer including an epoxy; and an electromagnetic interference (EMI) absorption layer disposed on the adhesive layer and including a thermoset epoxy resin and a plurality of magnetic metal particles which are distributed in the thermoset epoxy resin, and the magnetic metal particles include iron, and a ratio of a gross weight of the plurality of magnetic metal particles to a gross weight of the EMI absorption layer is higher than bout 40%, and a peel strength of the adhesive layer and the EMI (Continued)

absorption layer after the adhesive layer is cured is about 5 times or more greater than a peel strength of the adhesive layer and the EMI absorption layer before the adhesive layer is cured.

20 Claims, 2 Drawing Sheets

(51) Int. Cl.
*C09J 9/00* (2006.01)
*C09J 11/04* (2006.01)
*C09J 163/00* (2006.01)
*H01L 23/552* (2006.01)
*H01L 25/065* (2023.01)
*C08K 3/02* (2006.01)
*C08K 3/08* (2006.01)

(52) U.S. Cl.
CPC .......... *C09J 163/00* (2013.01); *H01L 23/552* (2013.01); *H01L 25/0655* (2013.01); *C08K 2003/023* (2013.01); *C08K 2003/0812* (2013.01); *C08K 2003/0856* (2013.01); *C08K 2201/01* (2013.01); *C09J 2203/326* (2013.01); *C09J 2463/00* (2013.01)

(56) References Cited

U.S. PATENT DOCUMENTS

| | | |
|---|---|---|
| 2014/0146477 A1 | 5/2014 | Youn |
| 2015/0129874 A1 | 5/2015 | Choi et al. |
| 2015/0179588 A1 | 6/2015 | Choi et al. |
| 2016/0133579 A1 | 5/2016 | Akiba et al. |
| 2017/0251549 A1 | 8/2017 | Lee et al. |
| 2017/0278804 A1 | 9/2017 | Kawabata et al. |

FOREIGN PATENT DOCUMENTS

| | | |
|---|---|---|
| JP | 2020013848 A | 1/2020 |
| KR | 20150055987 A | 5/2015 |

OTHER PUBLICATIONS

Joo. "Evaluation of Package-Level EMI Shielding Using Conformally Coated Conductive and Magnetic Materials in Low and High Frequency Ranges." 2020 IEEE 70th Electronic Components and Technology Conference (ECTC), pp. 647-652.

MULTILAYER TAPE INCLUDING PLURALITY OF MAGNETIC METAL PARTICLES AND ELECTRONIC ASSEMBLY INCLUDING THE SAME

CROSS REFERENCE TO RELATED APPLICATIONS

This application is a national stage filing under 35 U.S.C. 371 of PCT/IB2021/053460, filed Apr. 27, 2021, which claims the benefit of Korean Application No. 10-2020-0060566, filed May 20, 2020, the disclosure of which is incorporated by reference in its/their entirety herein.

BACKGROUND

Technical Field

The present disclosure relates to a multilayer tape including a plurality of magnetic metal particles and an electronic assembly.

Background Art

Electromagnetic waves are normally generated in electronic products. Electromagnetic waves refer to propagation of waves in which an electric field and a magnetic field are combined.

The electric field constituting electromagnetic waves may be easily blocked by using a conductor. For example, the electric field may be blocked by grounding the roof, wall surface, floor, etc. of a building to the ground or by using a shielding material such as grounded aluminum.

However, in the case of the magnetic field constituting electromagnetic waves, a special material having high permeability should be used to block. Such a magnetic field is harmful to human body, and may cause noises or malfunction to industrial and home devices.

Accordingly, harmfulness of electromagnetic waves is recognized and much effort is made in all countries of the world to prevent malfunction of devices caused by electromagnetic waves and to protect users from harmful environments by setting standards of electro magnetic interference (EMI) and electro magnetic susceptibility (EMS).

SUMMARY

Technical Problem

Embodiments of the present disclosure are invented in the above-described background, and provide a multi-tape including a plurality of magnetic metal particles to have an excellent electromagnetic wave blocking effect compared to related-art technology, and an electronic assembly.

The objects to be achieved by the present disclosure are not limited to those mentioned above, and other objects that are not mentioned above may be clearly understood to those skilled in the art based on the description provided below.

Technical Solution

A multilayer tape according to an embodiment of the present disclosure may include an adhesive layer including an epoxy, and an electromagnetic interference (EMI) absorption layer disposed on the adhesive layer and including a thermoset epoxy resin and a plurality of magnetic metal particles which are distributed in the thermoset epoxy resin, and the magnetic metal particles may include iron, a ratio of a gross weight of the plurality of magnetic metal particles to a gross weight of the EMI absorption layer may be higher than about 40%, and a peel strength of the adhesive layer and the EMI absorption layer after the adhesive layer is cured may be about 5 times or more greater than a peel strength of the adhesive layer and the EMI absorption layer before the adhesive layer is cured.

An electronic assembly according to another embodiment of the present disclosure may include: a circuit board including an electro-conductive trace and a first edge surface; an electronic element mounted on the circuit board, electrically connected to the electro-conductive trace, and including a lateral edge spatially spaced apart from the first edge surface; a protection layer disposed on the electronic element, substantially surrounding the electronic element, and having a planar top surface; and an electromagnetic interference (EMI) absorption layer disposed on the protection layer through an adhesive layer, and bonded to the protection layer, and the first edge surface may connect a major top surface and a major bottom surface of the protection layer, an average thickness of the protection layer may be equal to or greater than a height of the electronic element, the protection layer may include a second edge surface connecting a major top surface and a major bottom surface of the protection layer, the EMI absorption layer may include a resin and a plurality of magnetic metal particles which are distributed in the resin, the EMI absorption layer and the protection layer may include a coupled third edge surface which connects a major top surface of the EMI absorption layer and the major bottom surface of the protection layer, and the first edge surface, the second edge surface, and the third edge surface may be substantially aligned with one another, thereby forming a substantially planar coupling edge surface.

An electronic assembly according to still another embodiment of the present disclosure may include: a circuit board including a plurality of electro-conductive traces; a plurality of spaced-apart semiconductor integrated circuits which are mounted on the circuit board and are electrically connected to the plurality of electro-conductive traces; a protection layer disposed on the semiconductor integrated circuits, substantially surrounding the semiconductor integrated circuits, and having a planar top surface; and an EMI protection layer disposed on the protection layer through an adhesive layer, and bonded to the protection layer, and the EMI protection layer may include a resin and a plurality of magnetic metal particles which are distributed in the resin, the magnetic metal particles may include iron, silicon, and aluminum, and a ratio of a gross weight of the plurality of magnetic metal particles to a gross weight of the EMI absorption layer may be higher than about 40%.

Advantageous Effects

According to embodiments of the present disclosure, there is an effect that EMI blocking efficiency of a multilayer tape is enhanced by an EMI absorption layer including a plurality of magnetic metal particles.

DETAILED DESCRIPTION

Advantages and features of the present disclosure, and a method for achieving the same will be clarified by referring to embodiments described in detail below along with the accompanying drawings. However, the present disclosure is not limited to the exemplary embodiments set forth herein, and may be embodied in many different forms. Rather, the exemplary embodiments are provided so that the present disclosure will be thorough and complete, and will fully convey the scope of the present disclosure to those of ordinary skill in the art, and the present disclosure is defined by the scope of the claims.

Further, in explaining embodiments of the present disclosure, any specific explanation on a well-known related function or configuration deemed to obscure the gist of the present disclosure will be omitted. Also, the terms used herein are defined according to the functions of the embodiments of the present disclosure. Thus, the terms may vary depending on users' or operators' intentions or practices. Therefore, the terms used herein should be understood based on the descriptions made herein.

Figure 1:
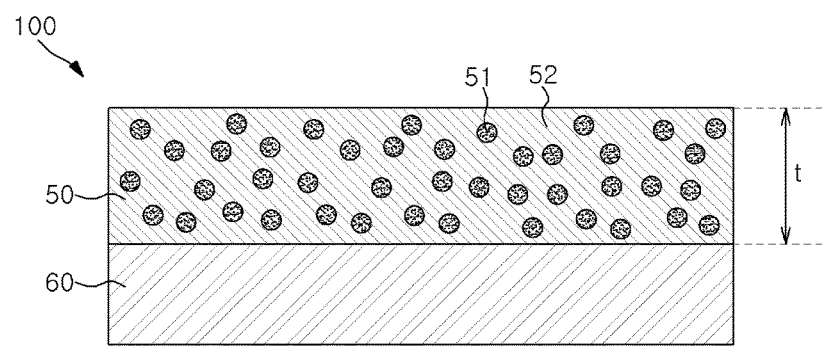
FIG. 1 is a schematic cross-sectional view of a multilayer tape according to an embodiment of the present disclosure.

FIG. 1 is a schematic cross-sectional view of a multilayer tape according to an embodiment of the present disclosure.

Referring to FIG. 1, the multilayer tape 100 may include an electromagnetic interference (EMI) absorption layer 50 and an adhesive layer 60. According to an embodiment, the multilayer tape 100 may include various components that are not selectively mentioned. That is, the cross section of the multilayer tape 100 shown in FIG. 1 is merely an example.

Figure 2:
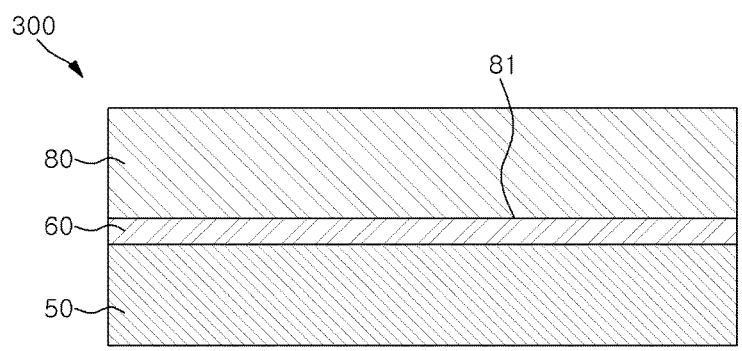
FIG. 2 is a schematic cross-sectional view of a semiconductor assembly including the multilayer tape of FIG. 1.
Figure 3:
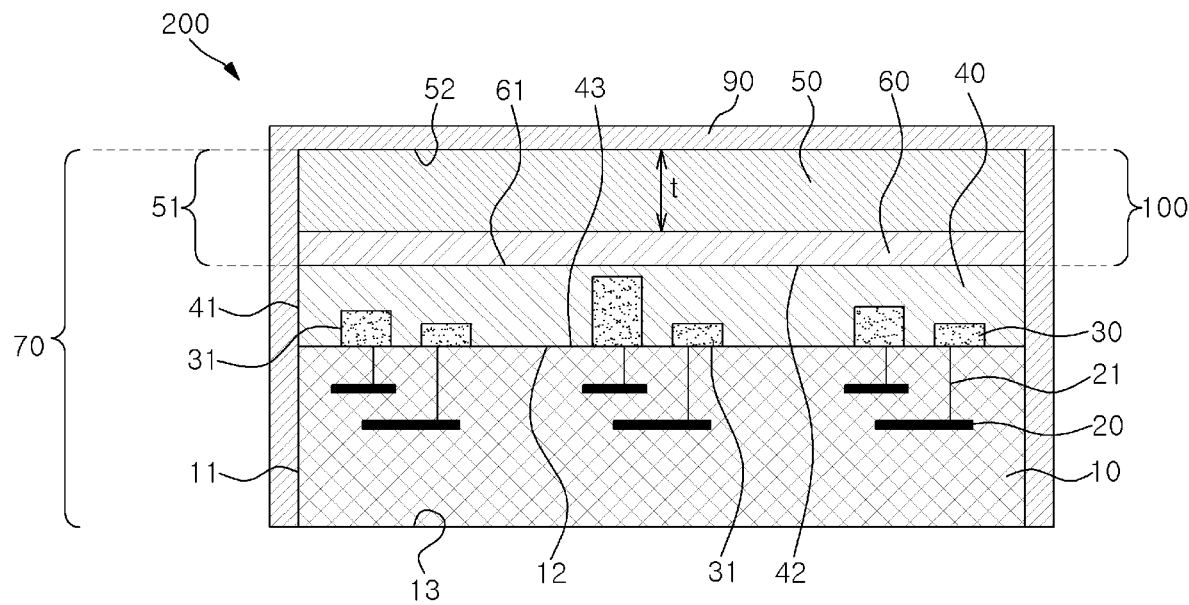
FIG. 3 is a schematic cross-sectional view of an electronic assembly according to an embodiment of the disclosure.

The adhesive layer 60 is configured to perform a role as an adhesive to bond the EMI absorption layer 60 and another configuration, and may include an epoxy (epoxy resin). For example, the adhesive layer 60 may bond the EMI absorption layer 50 and a semiconductor wafer 80 (FIG. 2) as shown in FIG. 2, and the adhesive layer 60 may bond the EMI absorption layer 50 and a protection layer 40 (FIG. 3) as shown in FIG. 3.

The adhesive layer 60 is cured, so that a peel strength between the adhesive layer 60 and the EMI absorption layer 50 can increase by about 5 times or more compared to that before the adhesive layer 60 is cured. Alternatively, according to an embodiment, the peel strength between the adhesive layer 60 and the EMI absorption layer 50 may increase by about 10 times, 20 times, or 40 times or more compared to that before the adhesive layer 60 is cured.

The EMI absorption layer 50 is configured to block electromagnetic waves emitted from an electronic element included in an electronic assembly or emitted toward the electronic element from the outside, and the EMI absorption layer 50 may be disposed on the adhesive layer 60.

The EMI absorption layer 50 may include a plurality of magnetic metal particles 51 and a resin 52. To increase the EMI blocking effect, the plurality of magnetic metal particles 51 may be configured to be distributed and positioned in places in the resin 52 included in the EMI absorption layer 50, respectively. Herein, the resin 52 may be a thermoset epoxy resin.

According to an embodiment, a ratio of a gross weight of the plurality of magnetic metal particles 51 to a gross weight of the EMI absorption layer 50 may be higher than about 40%. That is, the ratio of the weight occupied by the plurality of magnetic metal particles 51 in the EMI absorption layer 50 may be higher than about 40%.

According to another embodiment, the ratio of the gross weight of the plurality of magnetic metal particles 51 to the gross weight of the EMI absorption layer 50 may be higher than about 50%, may be higher than about 60%, or may be higher than about 80%.

An average thickness t of the EMI absorption layer 50 may be between about 10 microns and about 100 microns.

The magnetic metal particles 51 may include a material for absorbing electromagnetic waves.

According to an embodiment, the magnetic metal particles 51 may include iron.

According to another embodiment, the magnetic metal particles 51 may include iron, silicon, and aluminum.

According to still another embodiment, the magnetic metal particles 51 may include one or more of iron, nickel, chromium, zinc, magnesium, cobalt, molybdenum, vanadium, boron, and niobium.

According to yet another embodiment, the magnetic metal particles 51 may include one or more of iron, nickel-zinc ferrite, magnesium-zinc ferrite, and iron-silicon-chromium alloy.

FIG. 2 is a schematic cross-sectional view of a semiconductor assembly including the multilayer tape of FIG. 1.

Referring to FIG. 2, the semiconductor assembly 300 may include an EMI absorption layer 50, an adhesive layer 60, and a semiconductor wafer 80.

The EMI absorption layer 50 shown in FIG. 2 may perform substantially the same function as the EMI absorption layer 50 shown in FIG. 1. Accordingly, regarding the EMI absorption layer 50 shown in FIG. 2, reference is made to the descriptions of the EMI absorption layer 50 shown in FIG. 1.

In addition, regarding contents that are not contrary to the contents described through FIG. 2 in the descriptions of the adhesive layer 60 shown in FIG. 1, reference is made to the descriptions of the adhesive layer 60 shown in FIG. 2.

The adhesive layer 60 may be disposed between the EMI absorption layer 50 and the semiconductor wafer 80 to bond the EMI absorption layer 50 and the semiconductor wafer 80.

To achieve this, the adhesive layer 60 may be disposed on a major surface 81 of the semiconductor wafer 80 to be bonded to the major surface 81 of the semiconductor wafer 80.

The semiconductor wafer 80 is a circular plate that is used for making an electronic element 30 (FIG. 3), and may be disposed on the adhesive layer 60. The semiconductor wafer 80 may be bonded to the EMI absorption layer 50 by using the adhesive layer 60, thereby being disposed on the EMI absorption layer 50.

The semiconductor wafer 80 may include a material for forming a plate which is used for making the electronic element 30 (FIG. 3). For example, the semiconductor wafer 80 may include one or more of silicon (Si), silicon carbide (SiC), germanium-doped silicon (SiGe), germanium (Ge), gallium arsenide (GaAs), indium phosphide (InP), gallium phosphide (GaP), gallium nitride (GaN), aluminium nitride (AlN) and indium gallium nitride (InGaN).

FIG. 3 is a schematic cross-sectional view of an electronic assembly according to an embodiment of the disclosure.

Referring to FIG. 3, the electronic assembly 200 may include a circuit board 10, a trace 20, an electronic element 30, a protection layer 40, an EMI absorption layer 50, an adhesive layer 60, and a metal layer 90. According to an embodiment, the electronic assembly 200 may include various components that are not selectively mentioned. That is, the cross section of the electronic assembly 200 shown in FIG. 3 is merely an example.

The circuit board 10 is configured to have various types of components mounted thereon, and may be referred to as a board 10 according to an embodiment. According to an embodiment, the circuit board 10 may include a printed circuit board, etc.

The circuit board 10 may be provided with a major top surface 12 and a major bottom surface 13, and a first edge surface 11 as a side surface connecting the same.

The trace 20 is configured to have electrical conductivity, and may be referred to as an electro-conductive trace according to an embodiment. At least one trace 20 may be included or disposed inside the circuit board 10 or on the surfaces 11 to 13 of the circuit board 10 described above. The components disposed (or mounted) in the circuit board 10 may exchange signals with one another through the trace 20 included or disposed in the circuit board 10.

The electronic element 30 is designed and configured to perform various functions. For example, the electronic element 30 may include a semiconductor integrated circuit (semiconductor IC), or a complementary metal-oxide semiconductor (CMOS) image sensor, etc.

The electronic element 30 may be electrically connected to the trace 20, and may be disposed (mounted) on the major top surface 12 of the circuit board 10. The electronic element 30 may be disposed to have a space between a lateral edge 31 thereof and the first edge surface 11 of the circuit board 10, that is, to be spatially spaced apart. When a plurality of electronic elements 30 are disposed on the major top surface 12 of the circuit board 10, the plurality of electronic elements 30 may be disposed to have a space therebetween, that is, to be spatially spaced apart from one another, respectively.

When the electronic element 30 is disposed on the major top surface 12 of the circuit board 10, the protection layer 40 may be disposed on the electronic element 30 to substantially cover the electronic element 30 disposed on the major top surface 12 of the circuit board 10. Herein, the protection layer 40 'being disposed to cover (that is, being disposed to encapsulate)' the electronic element 30 implies that the protection layer 40 is disposed to surround a part or all of the other surfaces of the electronic element 30 except for a surface contacting the circuit board 10.

The protection layer 40 may be provided with a major top surface 42, a major bottom surface 43, and a second edge surface 41 as a side surface connecting the same.

The major top surface 42 of the protection layer 40 may be substantially planar. When the plurality of electronic elements 30 are disposed on the circuit board 10, the heights of the respective electronic elements 30 may be different from one another since types of the electronic elements 30 are different. In this case, the protection layer 40 is disposed to substantially cover the plurality of electronic elements 30, such that the adhesive layer 60 is disposed on a planar surface (that is, a top surface of the planar protection layer 40) regardless of the heights of the plurality of electronic elements 30.

According to an embodiment, the protection layer 40 may include an epoxy molding compound (EMC).

The adhesive layer 60 may be disposed on the protection layer 40 to bond the protection layer 40 and the EMI absorption layer 50.

The EMI absorption layer 50 is disposed on the adhesive layer 60 and is configured to block electromagnetic waves emitted from the electronic element 30 or emitted toward the electronic element 30 from the outside.

The multilayer tape 100 including the EMI absorption layer 50 and the adhesive layer 60 may be provided with a major top surface 52, a major bottom surface 61, and a third edge surface 51 connecting the same.

Functions of the adhesive layer 60, the EMI absorption layer 50, and the multilayer tape 100 including the same are substantially the same as described in FIGS. 1 and 2, and thus descriptions thereof are omitted.

The metal layer 90 is configured to block an electric field emitted from the electronic element 30 or emitted toward the electronic element 30 from the outside. The metal layer 90 may be disposed on the EMI absorption layer 50, and specifically, may be disposed to cover the major top surface 52 of the EMI absorption layer 50 and a coupling edge surface 70.

The metal layer 90 may include a conductive ink. Herein, the conductive ink may be configured to include a plurality of materials of each of at least one type of silver, gold, palladium, copper, indium, zinc, titanium, iron, chrome, aluminum, tin, cobalt, platinum, and nickel particles.

Herein, the coupling edge surface 70 may refer to a virtual 'plane' which is substantially planar and is formed by substantially aligning the first edge surface 11 of the circuit board 10, the second edge surface 41 of the protection layer 40, and the third edge surface 51 of the multilayer tape 100 including the EMI absorption layer 50 and the adhesive layer 60.

Figure 4:
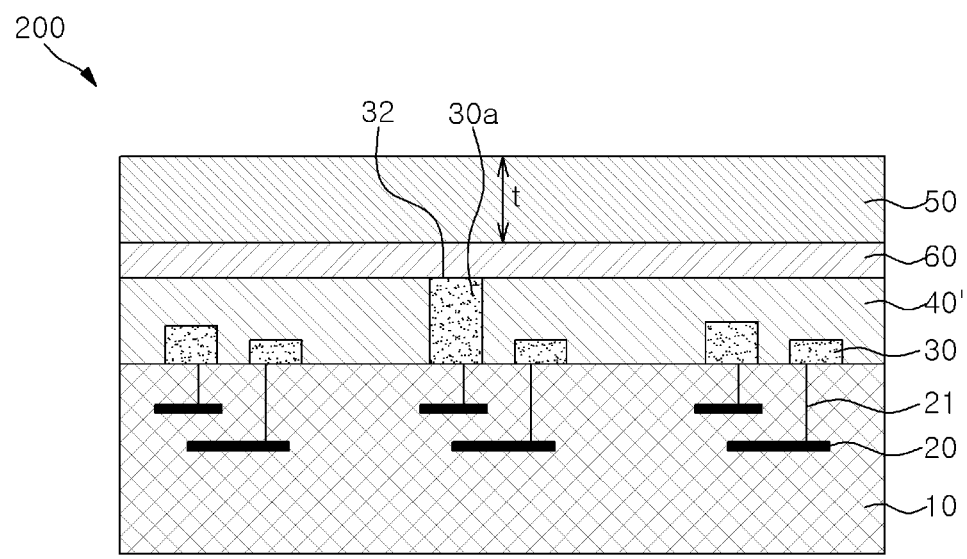
FIG. 4 is a schematic cross-sectional view of an electronic assembly according to another embodiment of the disclosure.

FIG. 4 is a schematic cross-sectional view of an electronic assembly according to another embodiment of the present disclosure.

Referring to FIG. 4, the electronic assembly 200 may include a circuit board 10, a trace 20, an electronic element 30, a protection layer 40', an adhesive layer 60, and an EMI absorption layer 50.

The circuit board 10, the trace 20, and the EMI absorption layer 50 shown in FIG. 4 may perform substantially the same functions as the circuit board 10, the trace 20, and the EMI absorption layer 50 shown in FIG. 3. Accordingly, regarding the circuit board 10, the trace 20, and the EMI absorption layer 50 shown in FIG. 4, reference is made to the descriptions of the circuit board 10, the trace 20, and the EMI absorption layer 50 shown in FIG. 3.

In addition, regarding contents that are not contrary to the contents described through FIG. 4 in the descriptions of the electronic element 30, the protection layer 40, and the adhesive layer 60 shown in FIG. 3, reference is made to the descriptions of the electronic element 30, the protection layer 40' and the adhesive layer 60 shown in FIG. 4.

The protection layer 40' may be disposed on the electronic element 30 to cover at least some of the plurality of electronic elements 30. That is, the protection layer 40' may be disposed on the electronic element 30 to cover the plurality of electronic elements 30 except for some electronic element 30a.

Herein, the protection layer 40"being disposed to cover (that is, being disposed to encapsulate) at least some electronic elements' implies that the protection layer 40' is disposed not to surround at least some 32 of the other surfaces of one or more electronic elements 30a of the plurality of electronic elements 30 except for a surface contacting the circuit board 10. As can be seen through FIG. 4, an average thickness of the protection layer 40' and a height of the electronic element 30a that is highest from among the plurality of electronic elements 30 are substantially the same as each other, and accordingly, the protection layer 40' may not be disposed to cover (to surround) the top surface 32 of the electronic element 30a. However, even in this case, the height of the electronic element 30a that is highest from among the plurality of electronic elements 30 may not be higher than the average thickness of the protection layer 40'.

The adhesive layer 60 may be attached to a top surface of the protection layer 40'. However, when the protection layer 40' is not disposed to surround the top surface 32 of the electronic element 30a as the average thickness of the protection layer 40' and the height of the electronic element 30a that is highest from among the plurality of electronic elements 30 are substantially the same as each other, the adhesive layer 60 may be attached to the top surface of the protection layer 40' and the top surface 32 of the electronic element 30a.

The following is a list of embodiments of present disclosure.

Item 1 relates to a multilayer tape including: an adhesive layer including an epoxy; and an electromagnetic interference (EMI) absorption layer disposed on the adhesive layer and including a thermoset epoxy resin and a plurality of magnetic metal particles which are distributed in the thermoset epoxy resin, wherein the magnetic metal particles includes iron, wherein a ratio of a gross weight of the plurality of magnetic metal particles to a gross weight of the EMI absorption layer is higher than about 40%, wherein a peel strength of the adhesive layer and the EMI absorption layer after the adhesive layer is cured is about 5 times or more greater than a peel strength of the adhesive layer and the EMI absorption layer before the adhesive layer is cured.

Item 2 relates to the multilayer tape, wherein the ratio of the gross weight of the plurality of magnetic metal particles to the gross weight of the EMI absorption layer is higher than about 50%.

Item 3 relates to the multilayer tape, wherein the ratio of the gross weight of the plurality of magnetic metal particles to the gross weight of the EMI absorption layer is higher than about 60%.

Item 4 relates to the multilayer tape, wherein the ratio of the gross weight of the plurality of magnetic metal particles to the gross weight of the EMI absorption layer is higher than about 80%.

Item 5 relates to the multilayer tape, wherein the peel strength of the adhesive layer and the EMI absorption layer after the adhesive layer is cured is about 10 times or more greater than the peel strength of the adhesive layer and the EMI absorption layer before the adhesive layer is cured.

Item 6 relates to the multilayer tape, wherein the peel strength of the adhesive layer and the EMI absorption layer after the adhesive layer is cured is about 20 times or more greater than the peel strength of the adhesive layer and the EMI absorption layer before the adhesive layer is cured.

Item 7 relates to the multilayer tape, wherein the magnetic metal particles further includes silicon and aluminum.

Item 8 relates to the multilayer tape, wherein the magnetic metal particles further include one or more of nickel, chromium, zinc, magnesium, cobalt, molybdenum, vanadium, boron, and niobium.

Item 9 relates to the multilayer tape, wherein the magnetic metal particles further include one or more of nickel-zinc ferrite, magnesium-zinc ferrite, and iron-silicon-chromium alloy.

Item 10 relates to a semiconductor assembly including: a semiconductor wafer; and the multilayer tape disposed on a major surface of the semiconductor wafer and bonded thereto.

Item 11 relates to the semiconductor assembly, wherein the semiconductor wafer includes one or more of silicon (Si), silicon carbide (SiC), germanium-doped silicon (SiGe), germanium (Ge), gallium arsenide (GaAs), indium phosphide (InP), gallium phosphide (GaP), gallium nitride (GaN), aluminium nitride (AlN) and indium gallium nitride (InGaN).

Item 12 relates to an electronic assembly including: a circuit board including an electro-conductive trace and a first edge surface; an electronic element mounted on the circuit board, electrically connected to the electro-conductive trace, and including a lateral edge spatially spaced apart from the first edge surface; a protection layer disposed on the electronic element, substantially surrounding the electronic element, and having a planar top surface; and an electromagnetic interference (EMI) absorption layer disposed on the protection layer through an adhesive layer, and bonded to the protection layer, wherein the first edge surface connects a major top surface and a major bottom surface of the protection layer, wherein an average thickness of the protection layer is equal to or greater than a height of the electronic element, wherein the protection layer includes a second edge surface connecting a major top surface and a major bottom surface of the protection layer, wherein the EMI absorption layer includes a resin and a plurality of magnetic metal particles which are distributed in the resin, wherein the EMI absorption layer and the protection layer include a coupled third edge surface which connects a major top surface of the EMI absorption layer and the major bottom surface of the protection layer, wherein the first edge surface, the second edge surface, and the third edge surface are substantially aligned with one another, thereby forming a substantially planar coupling edge surface.

Item 13 relates to the electronic assembly, wherein the electronic assembly includes a plurality of electronic elements arranged along the major top surface of the circuit board and mounted on the circuit board, wherein the circuit board includes a plurality of electro-conductive traces, wherein the electronic elements are electrically connected to the electro-conductive traces, and wherein each of the electronic elements includes a lateral edge spatially spaced apart from the first edge surface.

Item 14 relates to the electronic assembly, wherein the protection layer is disposed on each of the electronic elements, and substantially surrounds each of the electronic elements, and wherein the average thickness of the protection layer is equal to or greater than heights of the plurality of electronic elements.

Item 15 relates to the electronic assembly, wherein a ratio of a gross weight of the plurality of magnetic metal particles to a gross weight of the EMI absorption layer is higher than about 40%.

Item 16 relates to the electronic assembly, wherein a ratio of a gross weight of the plurality of magnetic metal particles to a gross weight of the EMI absorption layer is higher than about 80%.

Item 17 relates to the electronic assembly further including a metal layer disposed on the EMI absorption layer, wherein the metal layer covers the major top surface of the EMI absorption layer and the substantially planar coupling edge surface.

Item 18 relates to the electronic assembly, wherein the metal layer includes a conductive ink including a plurality of materials of each of at least one type of silver, gold, palladium, copper, indium, zinc, titanium, iron, chrome, aluminum, tin, cobalt, platinum, and nickel particles.

Item 19 relates to an electronic assembly including: a circuit board including a plurality of electro-conductive traces; a plurality of spaced-apart semiconductor integrated circuits which are mounted on the circuit board and are electrically connected to the plurality of electro-conductive traces; a protection layer disposed on the semiconductor integrated circuits, substantially surrounding the semiconductor integrated circuits, and having a planar top surface; and an EMI protection layer disposed on the protection layer through an adhesive layer, and bonded to the protection layer, wherein the EMI protection layer includes a resin and a plurality of magnetic metal particles which are distributed in the resin, wherein the magnetic metal particles include iron, silicon, and aluminum, wherein a ratio of a gross weight of the plurality of magnetic metal particles to a gross weight of the EMI absorption layer is higher than about 40%.

Item 20 relates to the electronic assembly, wherein the ratio of the gross weight of the plurality of magnetic metal particles to the gross weight of the EMI absorption layer is higher than about 80%.

Item 21 relates to the electronic assembly, wherein electro-conductive traces in the plurality of electro-conductive traces are electrically isolated from one another.

Item 22 relates to the electronic assembly, wherein the semiconductor integrated circuits are electrically connected with the electro-conductive traces which are different from one another, respectively.

Item 23 relates to the electronic assembly, wherein at least two electro-conductive traces of the plurality of traces are electrically connected to the same semiconductor integrated circuit.

Item 24 relates to the electronic assembly, wherein the protection layer includes an epoxy molding compound (EMC).

Item 25 relates to the electronic assembly, wherein the protection layer substantially surrounds each semiconductor integrated circuit in the plurality of spaced-apart semiconductor integrated circuits.

Item 26 relates to the electronic assembly, wherein the protection layer substantially encapsulates each semiconductor integrated circuit.

Item 27 relates to the electronic assembly, wherein the protection layer substantially encapsulates each semiconductor integrated circuit, except for a bottom surface of at least one semiconductor integrated circuit facing the circuit board.

Item 28 relates to the electronic assembly, wherein the protection layer encapsulates semiconductor integrated circuits in the plurality of spaced-apart semiconductor integrated circuit, except for a top surface of at least one semiconductor integrated circuit.

Item 29 relates to the electronic assembly, wherein an average thickness of the EMI absorption layer is between about 10 microns and about 100 microns.

Item 30 relates to the electronic assembly, wherein the electronic assembly includes a substantially planar edge surface which is extended from a major top surface of the EMI protection layer to a major bottom surface of the circuit board.

Item 31 relates to the electronic assembly, further including a metal layer disposed on the EMI absorption layer, wherein the metal layer covers the major top surface of the EMI absorption layer and the substantially planar edge surface.

Combinations of each block of the block diagram and each step of the flowchart attached to the present disclosure may be performed by computer program instructions. Since these computer program instructions may be mounted in an encoding processor of a generic-purpose computer, a special-purpose computer, or other programmable data processing equipment, the instructions performed through the encoding processor of the computer or other programmable data processing equipment generate a means for performing the functions described at each block of the block diagram or each step of the flowchart. Since these computer program instructions can be stored in a computer usable memory or a computer readable memory which is oriented toward the computer or other programmable data processing equipment to implement functions in a specific method, the instructions stored in the computer usable memory or the computer readable memory can produce a manufacturing item including an instruction means for performing the functions described at each block of the block diagram or each step of the flowchart. Since the computer program instructions can be mounted on the computer or other programmable data processing equipment, a series of operation steps may be performed on the computer or other programmable data processing equipment to generate a process executed by the computer, and the instructions performing the computer or other programmable data processing equipment can provide steps for executing the functions described at each block of the block diagram and each step of the flowchart.

In addition, each block or each step may indicate a part of a module, a segment, or a code including one or more executable instructions for executing specified logic function(s). In addition, it should be noted that, in some alternative embodiments, the functions mentioned at blocks or steps may be generated in random order. For example, two blocks or steps consecutively illustrated may be performed substantially at the same time or the blocks or steps may be performed occasionally in reverse order according to corresponding functions.

The above-described embodiments are merely examples of the technical concept of the present disclosure, and various modifications and changes can be made by a person skilled in the art without departing from the essential quality of the present disclosure. Therefore, the embodiments disclosed in the present disclosure are not intended to limit the technical concept of the present disclosure, and are just to describe the technical concept of the present disclosure, and the scope of the technical concept of the present disclosure is not limited by the embodiments. The scope of the present disclosure should be defined by the claims presented below, and all technical concepts within the equivalent scope thereto should be construed as being included in the scope of the present disclosure.

DESCRIPTION OF REFERENCE NUMERALS

100: multilayer tape
200: electronic assembly
300: semiconductor assembly
10: circuit board
20: trace
30: electronic element
40: protection layer
50: EMI absorption layer
60: adhesive layer 70: coupling edge surface
80: semiconductor wafer
90: metal layer

What is claimed is:
1. A multilayer tape comprising:
an adhesive layer comprising an epoxy; and
an electromagnetic interference (EMI) absorption layer disposed on the adhesive layer and comprising a thermoset epoxy resin and a plurality of magnetic metal particles which are distributed in the thermoset epoxy resin,
wherein the magnetic metal particles comprise iron,
wherein a ratio of a gross weight of the plurality of magnetic metal particles to a gross weight of the EMI absorption layer is higher than about 40%,
wherein a peel strength of the adhesive layer and the EMI absorption layer after the adhesive layer is cured is about 5 times or more greater than a peel strength of the adhesive layer and the EMI absorption layer before the adhesive layer is cured.

2. The multilayer tape of claim 1, wherein the magnetic metal particles further comprise silicon and aluminum.

3. A semiconductor assembly comprising:
a semiconductor wafer; and
the multilayer tape of claim 1 disposed on a major surface of the semiconductor wafer and bonded thereto.

4. The multilayer tape of claim 1, wherein the magnetic metal particles further comprise one or more of nickel, chromium, zinc, magnesium, cobalt, molybdenum, vanadium, boron, and niobium.

5. The multilayer tape of claim 1, wherein the magnetic metal particles comprise one or more of nickel-zinc ferrite, magnesium-zinc ferrite, and iron-silicon-chromium alloy.

6. An electronic assembly comprising:
a circuit board comprising an electro-conductive trace and a first edge surface;
an electronic element mounted on the circuit board, electrically connected to the electro-conductive trace, and comprising a lateral edge spatially spaced apart from the first edge surface;
a protection layer disposed on the electronic element, substantially surrounding the electronic element, and having a planar top surface; and
an electromagnetic interference (EMI) absorption layer disposed on the protection layer through an adhesive layer, and bonded to the protection layer,
wherein the first edge surface connects a major top surface and a major bottom surface of the protection layer,
wherein an average thickness of the protection layer is equal to or greater than a height of the electronic element,
wherein the protection layer comprises a second edge surface connecting a major top surface and a major bottom surface of the protection layer,
wherein the EMI absorption layer comprises a resin and a plurality of magnetic metal particles which are distributed in the resin,
wherein the EMI absorption layer and the protection layer comprise a coupled third edge surface which connects a major top surface of the EMI absorption layer and the major bottom surface of the protection layer,
wherein the first edge surface, the second edge surface, and the third edge surface are substantially aligned with one another, thereby forming a substantially planar coupling edge surface.

7. The electronic assembly of claim 6, wherein the electronic assembly comprises a plurality of electronic elements arranged along the major top surface of the circuit board and mounted on the circuit board, wherein the circuit board comprises a plurality of electro-conductive traces, wherein the electronic elements are electrically connected to the electro-conductive traces, and wherein each of the electronic elements comprises a lateral edge spatially spaced apart from the first edge surface.

8. The electronic assembly of claim 7, wherein the protection layer is disposed on each of the electronic elements, and substantially surrounds each of the electronic elements, and wherein the average thickness of the protection layer is equal to or greater than heights of the plurality of electronic elements.

9. The electronic assembly of claim 6, further comprising a metal layer disposed on the EMI absorption layer, wherein the metal layer covers the major top surface of the EMI absorption layer and the substantially planar coupling edge surface.

10. The electronic assembly of claim 6, wherein a ratio of a total volume of the plurality of the magnetic metal particles to a total volume of the EMI absorbing layer is greater than about 40%.

11. The electronic assembly of claim 9, wherein the first metal layer comprises a conductive ink comprising a plurality of at least one of silver, gold, palladium, copper, indium, zinc, titanium, iron, chrome, aluminum, tin, cobalt, platinum, and nickel particles.

12. An electronic assembly comprising:
a circuit board comprising a plurality of electro-conductive traces;
a plurality of spaced-apart semiconductor integrated circuits which are mounted on the circuit board and are electrically connected to the plurality of electro-conductive traces;
a protection layer disposed on the semiconductor integrated circuits, substantially surrounding the semiconductor integrated circuits, and having a planar top surface; and
an EMI protection layer disposed on the protection layer through an adhesive layer, and bonded to the protection layer,
wherein the EMI protection layer comprises a resin and a plurality of magnetic metal particles which are distributed in the resin,
wherein the magnetic metal particles comprise iron, silicon, and aluminum,
wherein a ratio of a gross weight of the plurality of magnetic metal particles to a gross weight of the EMI absorption layer is higher than about 40%.

13. The electronic assembly of claim 12, wherein the protection layer substantially surrounds each semiconductor integrated circuit in the plurality of spaced-apart semiconductor integrated circuits.

14. The electronic assembly of claim 12, wherein the electronic assembly comprises a substantially planar edge surface which is extended from a major top surface of the EMI protection layer to a major bottom surface of the circuit board, and a metal layer disposed on the EMI absorption layer, wherein the metal layer covers the major top surface of the EMI absorption layer and the substantially planar edge surface.

15. The electronic assembly of claim 12, wherein the electrically conductive traces in the plurality of electrically conductive traces are electrically isolated from each other.

16. The electronic assembly of claim 12, wherein the protective layer comprises an epoxy molding compound (EMC).

17. The electronic assembly of claim 12, wherein the protective layer substantially encapsulates each semiconductor integrated circuit.

18. The electronic assembly of claim 12, wherein the protective layer substantially encapsulates each semiconductor integrated circuit except for a bottom side of at least one of the semiconductor integrated circuit facing the circuit board.

19. The electronic assembly of claim 12, wherein the protective layer substantially encapsulates the semiconductor integrated circuits in the plurality of spaced apart semiconductor integrated circuits except for a top surface of at least one of the semiconductor integrated circuits.

20. The electronic assembly of claim 12, wherein an average thickness of the EMI absorbing layer is between about 10 and about 100 microns.

\* \* \* \* \*